US010026732B2

(12) United States Patent
Rahimo et al.

(10) Patent No.: US 10,026,732 B2
(45) Date of Patent: Jul. 17, 2018

(54) BIDIRECTIONAL POWER SEMICONDUCTOR

(71) Applicant: ABB Schweiz AG, Baden (CH)

(72) Inventors: Munaf Rahimo, Uezwil (CH); Martin Arnold, Cambridge (GB); Umamaheswara Vemulapati, Wettingen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/626,777

(22) Filed: Jun. 19, 2017

(65) Prior Publication Data

US 2017/0294435 A1 Oct. 12, 2017

Related U.S. Application Data

(63) Continuation of application No. PCT/EP2015/079949, filed on Dec. 16, 2015.

(30) Foreign Application Priority Data

Dec. 17, 2014 (EP) .................................... 14198502

(51) Int. Cl.
H01L 29/747 (2006.01)
H01L 27/08 (2006.01)
H01L 29/74 (2006.01)
H01L 29/06 (2006.01)

(52) U.S. Cl.
CPC ...... *H01L 27/0817* (2013.01); *H01L 29/7404* (2013.01); *H01L 29/747* (2013.01); *H01L 29/0692* (2013.01)

(58) Field of Classification Search
CPC .......................... H01L 27/0817; H01L 29/747
See application file for complete search history.

(56) References Cited

U.S. PATENT DOCUMENTS

| 6,078,065 | A | 6/2000 | Streit et al. | |
| 8,847,277 | B2 * | 9/2014 | Rahimo | ............. H01L 29/7416 257/152 |
| 9,543,305 | B2 * | 1/2017 | Lophitis | ............. H01L 29/7416 |

FOREIGN PATENT DOCUMENTS

| EP | 0110777 A1 | 6/1984 |
| EP | 0880182 A2 | 11/1998 |
| JP | S55124262 A | 9/1980 |

(Continued)

OTHER PUBLICATIONS

European Patent Office, International Search Report and Written Opinion issued in corresponding Application No. PCT/EP2015/079949, dated Mar. 17, 2016, 11 pp.

*Primary Examiner* — Allison P Bernstein

(74) *Attorney, Agent, or Firm* — Taft Stettinius & Hollister LLP; J. Bruce Schelkopf

(57) ABSTRACT

A bidirectional power semiconductor device with full turn-off control in both current directions and improved electrical and thermal properties is provided, the device comprises a plurality of first gate commutated thyristor (GCT) cells and a plurality of second GCT cells alternating with each other, a first base layer of each first GCT cell is separated from a neighbouring second anode layer of a neighbouring second GCT cell by a first separation region, and a second base layer of each second GCT cell is separated from a neighbouring first anode layer of a neighbouring first GCT cell by a second separation region.

20 Claims, 3 Drawing Sheets

(56) References Cited

FOREIGN PATENT DOCUMENTS

| JP | S5749269 | A  | 3/1982 |
|----|----------|----|--------|
| WO | 2012041958 | A2 | 4/2012 |
| WO | 2012041958 | A3 | 4/2012 |

* cited by examiner

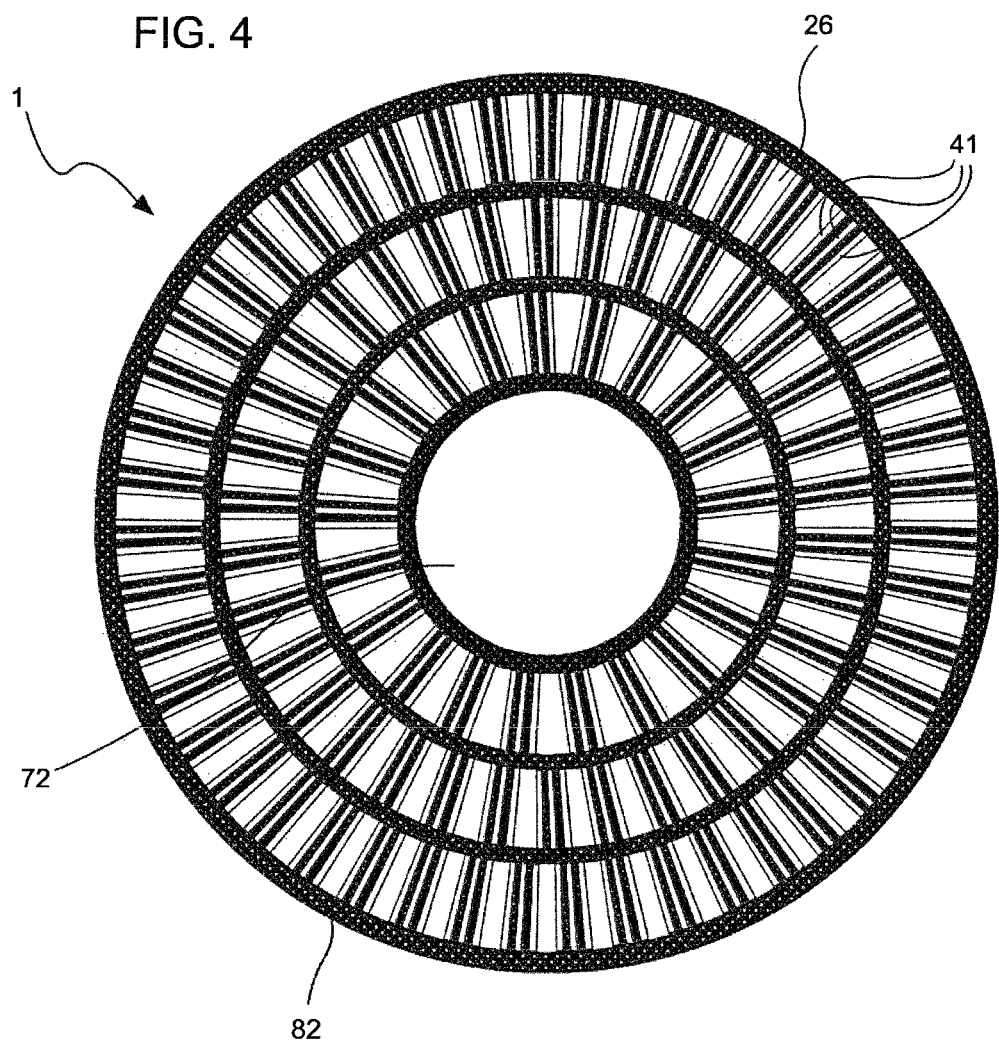

BIDIRECTIONAL POWER SEMICONDUCTOR

FIELD OF THE INVENTION

The present invention relates to a bidirectional power semiconductor device according to the preamble of claim 1.

BACKGROUND OF THE INVENTION

In many applications such as matrix converters and direct current (DC) breakers, bidirectional power device functionality is required to block voltage and to conduct current in both directions. Power semiconductor devices such as the triac known from JP 57-049269 A or the bidirectionally controlled thyristor (BCT) known from EP 0 880 182 B1 offer such functionality but full switching control is limited to turn-on only. Moreover, in these power devices only half of the wafer area is used for each current direction or polarity.

To achieve full turn-off control, an insulated gate bipolar transistor (IGBT) has been reported with the emitter MOS structure employed on both sides while using the metal-oxide-semiconductor (MOS) cell p-well as an anode for the opposite emitter. However, it is difficult to implement such structure on both sides of an IGBT chip since the planar termination is constrained by the subsequent die attach for packaging and the gate access also adds further complexity. This problem is especially prominent in higher voltage devices with a rated voltage above 1200 V. Hence, it is traditionally much easier to implement reverse blocking (RB) or bidirectional devices in thyristor or gate commutated thyristor (GCT) wafers with bevel termination packaged in standard press packs.

For bidirectional power semiconductor device functionality, nowadays usually two reverse blocking (RB) power semiconductor devices are used in antiparallel configuration or two reverse-conducting (RC) power semiconductor devices are used in back-to-back configuration.

When two RB power semiconductor devices are connected in antiparallel configuration this has the disadvantage that only the device area of one of these two RB power semiconductor devices is used for each current direction. Accordingly, this configuration results in a large device and thermal management becomes difficult as heat generation is not homogeneously distributed over the whole device area. The latter can easily result in overheating problems. On the other side a configuration with two RC power semiconductor devices in back-to-back configuration has the disadvantage of high losses as the losses of the two devices add up in the serial connection.

A known reverse-conducting power semiconductor device is the reverse-conducting gate commutated thyristor (RC-GCT) which combines one or more gate commutated thyristors (GCTs) and one or more diodes within a single power semiconductor device. The bi-mode gate commutated thyristor (BGCT) disclosed in WO 2012/041958 A2 is a RC-GCT, which comprises in a single semiconductor wafer a plurality of gate commutated thyristor (GCT) cells electrically connected in parallel to one another, and a plurality of diode cells distributed between the GCT cells. The diode cells are also electrically connected in parallel to one another and to the GCT cells, albeit with opposing forward direction. A known reverse-blocking power semiconductor device is the reverse blocking gate commutated thyristor (RB-GCT) which differs from the RC-GCT in that it has no diode cells connected in parallel to the GCT cells.

EP 0110 777 A1 shows an antiparallel configuration of two single reverse blocking GCT cell zones. Separation between the single first GCT cell zone and the single second GCT cell zone is formed by two grooves penetrating from the first or second main side of the semiconductor wafer through the p doped layers forming the anode and the base layers of the two GCT cells to the drift layer. The separation between the first and second cell zone being made by a groove (i.e. by air) results in a low thermal contact between the two cell zones so that heat is hindered from spreading out of the cell zone, in which it has been produced.

SUMMARY OF THE INVENTION

In view of the above described disadvantages of the prior art it is the object of the invention to provide a bidirectional power semiconductor device which allows full turn-off and turn-on switching control and which makes efficient use of the whole device area for both current directions to provide a small device with good electrical and thermal properties.

The object is attained by a bidirectional power semiconductor device according to claim 1.

In contrast to the known BCT, the bidirectional power semiconductor device of the invention comprises a plurality of first cell zones, each of which having a first gate commutated thyristor (GCT) cell, and a plurality of second cell zones, each of which having a second gate commutated thyristor (GCT) cell, wherein the first GCT cells alternate with the second GCT cells, i.e. the first cell zones alternate with the second cell zones. In the configuration of the invention the electron hole plasma in the first GCT cells can spread efficiently into the second drift layers of neighbouring second GCT cells, if the first GCT cells are in the on-state, and the electron hole plasma in the second GCT cells can spread efficiently into the first drift layers of neighbouring first GCT cells if the second GCT cells are in the on-state. Therefore, the bidirectional power semiconductor device of the invention makes efficient use of the whole wafer area for both current directions. That results in good electrical and thermal properties of the device, and the size of the device can be reduced.

Further, in contrast to the known BCT the first base layer of each first GCT cell is separated from a neighbouring second anode layer by a first separation region of the first conductivity type, and the second base layer of each second GCT cell is separated from a neighbouring first anode layer by a second separation region of the first conductivity type. This kind of separation allows full turn-off control in both current directions, i.e. turn-off control of the first and second GCT cells, which is not possible in a BCT where a continuous p-type layer connects the anode layer of a first thyristor cell to the base layer of a neighbouring second thyristor cell connected to the first thyristor cell in anti-parallel configuration.

Due to the separation between a first and second cell zone being made of a separation region of the first conductivity type (exemplarily by the first and second drift layer extending to the surface of the device such that the drift layer (i.e. the separation region) separates the first base and second anode layer and the second base and first anode layer. By these separation regions the heat can efficiently spread into the neighboured cell zone so that heat is quickly transferred into cooler regions so that the device does not heat up so much and therefore, can be operated at higher conditions (higher frequency/voltage/currents).

In an exemplary embodiment, due to the repetitive arrangement of first and second cell zones and a miniaturized structure of the cell zones, the distance between two neighboured first cell zones or two neighboured second cell zones can be made so small that the plasma of these neighboured cell zones overlaps so that the full wafer area of the device is thermally as well as electrically used. In FIG. 1 the hole density distribution in forward direction is schematically shown for two neighboured first cell zones by the dotted line.

Further developments of the invention are specified in the dependent claims.

In an exemplary embodiment, for each first gate commutated thyristor cell (in a first cell zone), the lateral distance between any point in the first base layer of this first gate commutated thyristor cell and the neighbouring second anode layer (in a second cell zone) is less than a first maximum distance, and the lateral distance between any point of the first anode layer of this first gate commutated thyristor cell and the neighbouring second base layer is less than the first maximum distance, wherein the first maximum distance is 1 mm, or 500 µm. In this exemplary embodiment the electron hole plasma of a second GCT cell in an on-state can reach substantially the whole region of the neighbouring first GCT cell to make efficient use of the whole wafer area for the current direction from the first main side to the second main side (which is the direction of the current through the second GCT cells in the on-state).

In another exemplary embodiment, for each second GCT cell, the lateral distance between any point in the second base layer of this second GCT cell and the neighbouring first anode layer is less than a second maximum distance, and the lateral distance between any point of the second anode layer of this second GCT cell and the neighbouring first base layer is less than the second maximum distance, wherein the second maximum distance is 1 mm, exemplarily 500 µm. In this exemplary embodiment the electron hole plasma of a first GCT cell in an on-state can reach substantially the whole region of the neighbouring second GCT cell to make efficient use of the whole wafer area for the current in a direction from the second main side to the first main side (which is the direction of the current through the first GCT cells in the on-state).

In another exemplary embodiment, in a projection in a direction orthogonal to the first and second main side, the first anode layer overlaps with the first cathode layer in each first GCT cell, and the second anode layer overlaps with the second cathode layer in each second GCT cell. In this exemplary embodiment, the electrical properties of the first and second GCT cells are improved.

Exemplarily, in the projection in the direction orthogonal to the first and second main side, the first anode layer is aligned with the first cathode layer to have a maximum overlap between these two layers in each first gate commutated thyristor cell, and the second anode layer is aligned with the second cathode layer to have a maximum overlap between these two layers in each second gate commutated thyristor cell. This allows optimization of the electrical properties of the device and a maximum current flow in the on-state of the first or second GCT cells.

In another exemplary embodiment each first gate electrode is formed as part of a first gate metallization layer on the first base layers, the surface of the first gate metallization layer opposite to the first base layers defining a first plane, each second gate electrode is formed as part of a second gate metallization layer on the second base layers, the surface of the second gate metallization layer opposite to the second base layers defining a second plane, the surfaces of the first cathode electrodes opposite to the first cathode layers and the surfaces of the second anode electrodes opposite to the second anode layers define a third plane, the surfaces of the first anode electrodes opposite to the first anode layers and the surfaces of the second cathode electrodes opposite to the second cathode layers define a fourth plane, the first plane is parallel to the third plane and is shifted from the third plane in a direction from the first main side to the second main side, and the second plane is parallel to the fourth plane and is shifted from the fourth plane in a direction from the second main side to the first main side. In this exemplary embodiment, the bevel termination allows to facilitate contacting of the anode and cathode electrodes in standard press packs.

In another exemplary embodiment, each one of the first and second cathode layers includes at least two cathode layer regions, which are separated from each other by the first or second base layer. In this exemplary embodiment, the distance of the cathode layer regions and the respective gate contact can be minimized to optimize the turn-on and turn-off control of the GCTs.

In another exemplary embodiment, each one of the cathode layer regions is strip-shaped with a length in the longitudinal axis and a width in a direction vertical to the longitudinal axis, wherein the width is less than the length. The use of strip-shaped cathode layer regions allows an efficient use of the wafer area.

In another exemplary embodiment, each one of the first and second cathode layers comprises 2 to 6 strip-shaped cathode layer regions. With this number of strip-shaped cathode layer regions per first and second cathode layer, it is possible to achieve efficient use of the whole wafer area for both current directions. Exemplarily, the width of each strip-shaped cathode semiconductor layer region is between 50 µm and 500 µm. By having such small number of cathode layer regions, the cell zones can be made so small such that plasma overlap can be efficiently be achieved between two directly neighboured first (or second) cell zones, and heat can still be efficiently be transferred into the other cell zone.

In an exemplary embodiment, the strip-shaped cathode layer regions are placed in concentric rings around the center of the device, the longitudinal axis of each strip extending along a radial direction which is a direction extending from the center of the device and parallel to the first and second main side. Such geometry allows most efficient use of the whole wafer area.

In an exemplary embodiment the ratio between the lateral width of the first base layer and that of the first anode layer and the ratio between the lateral width of the second base layer and that of the second anode layer are between 0.5 and 2, respectively.

In another exemplary embodiment the first and second drift layers of the first and second gate commutated thyristor cells form one continuous semiconductor layer extending parallel to and between the first and second main side of the wafer.

In another exemplary embodiment the first and the second base layers have a greater thickness in a direction orthogonal to the first and second main side than the first and second anode layers.

In another exemplary embodiment the distance between each pair of neighbouring first base layer and second anode layer and the distance between each pair of neighbouring second base layer and first anode layer is in a range between 20 µm and 100 µm.

BRIEF DESCRIPTION OF THE DRAWINGS

Detailed embodiments of the invention will be explained below with reference to the accompanying figures, in which:

FIG. 4 shows a top view onto the second main side of the bidirectional power semiconductor device shown in FIG. 1.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF EXEMPLARY EMBODIMENTS

Figure 1:
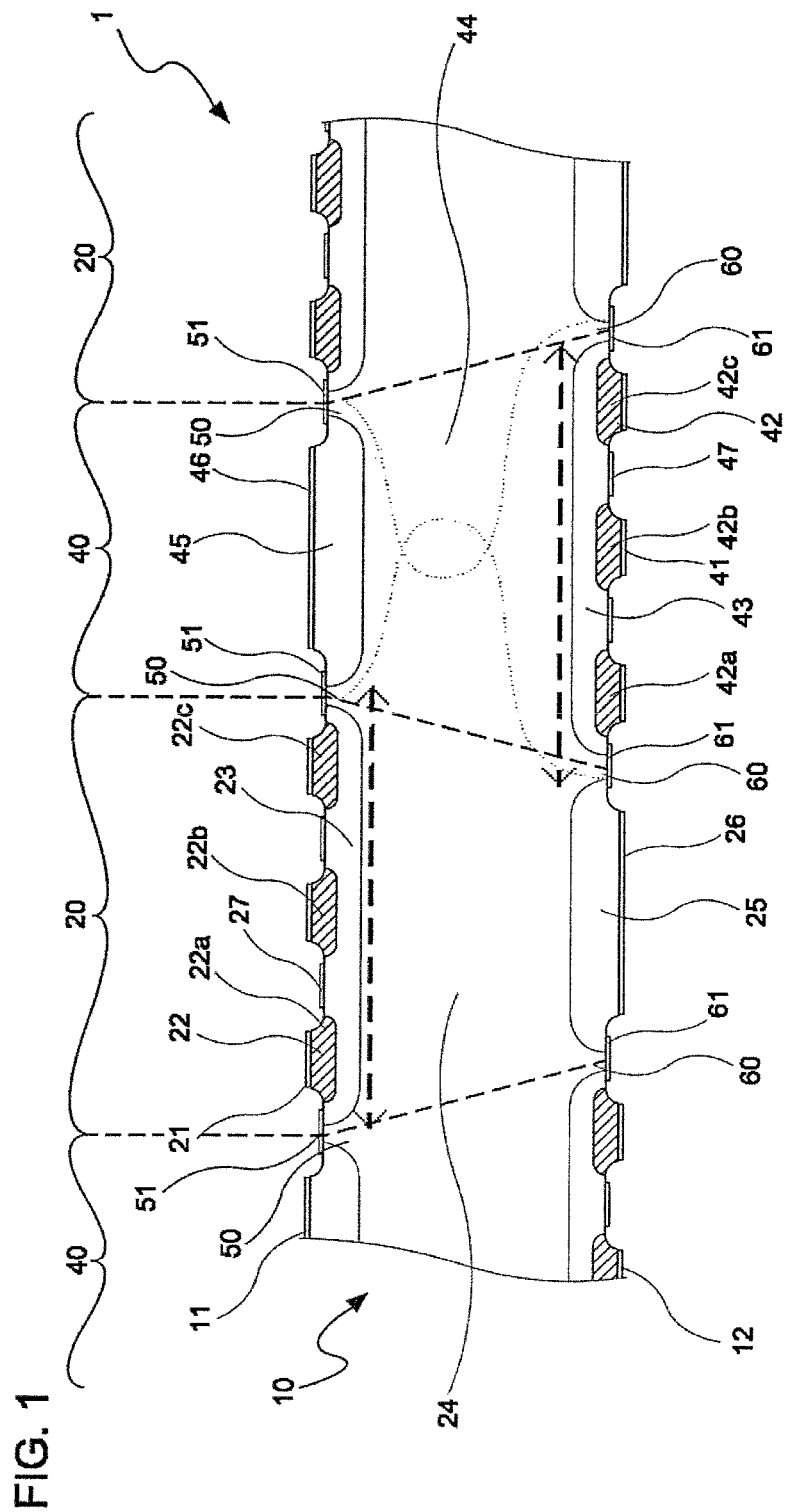
FIG. 1 shows a cross-sectional view of the bidirectional power semiconductor device according to an embodiment of the invention.
Figure 2:
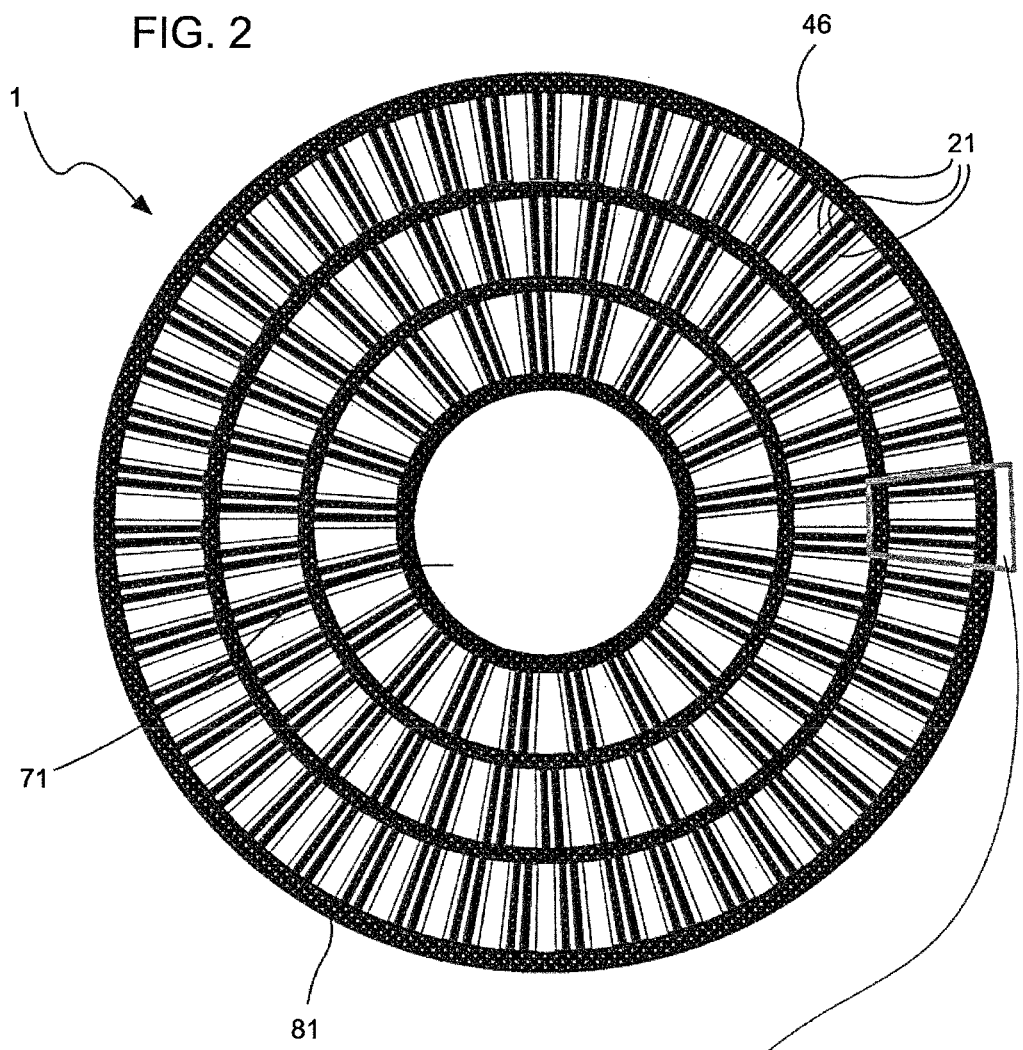
FIG. 2 shows a top view onto the first main side of the bidirectional power semiconductor device shown in FIG. 1.
Figure 3:
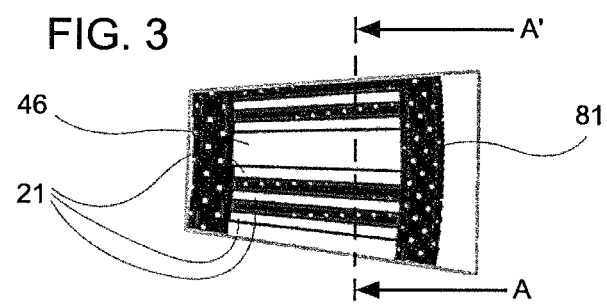
FIG. 3 shows an enlarged cut-out of the top view shown in FIG. 2.

In FIGS. 1 to 4 there is shown an embodiment of the bidirectional power semiconductor device according to the invention. FIG. 1 shows a partial cross-sectional view of the bidirectional power semiconductor device along a line AA' in FIG. 3. FIG. 2 shows a top view onto the first main side of the bidirectional power semiconductor device and FIG. 3 shows an enlarged partial view of the top view shown in FIG. 2. FIG. 4 shows a top view onto the second main side of the bidirectional power semiconductor device.

The bidirectional power semiconductor device 1 according to the first embodiment comprises a semiconductor wafer 10, exemplarily a silicon wafer, having a first main side 11 and a second main side 12, which is arranged parallel to the first main side 11. The bidirectional power semiconductor device 1 comprises a plurality of first cell zones (i.e. at least two or at least three), each of which having a first gate commutated thyristor (GCT) cell 20, and a plurality of second cell zone (i.e. at least two or at least three), each of which having a second GCT cell 40. The first and second cell zones alternate. Each first GCT cell 20 comprises, in the order from the first main side 11 to the second main side 12, a first cathode electrode 21, an n-type first cathode layer 22, a p-type first base layer 23, an n⁻-type first drift layer 24, a p-type first anode layer 25, and a first anode electrode 26. Each first GCT cell 20 further comprises a first gate electrode 27 which is arranged lateral to the first cathode layer 22 and separated from the first cathode layer 22 by the first base layer 23. Throughout this patent specification the term "lateral" relates to a lateral direction which is a direction parallel to the first main side 11. The bidirectional power semiconductor device 1 further comprises a plurality of second GCT cells 40. Each of the second GCT cells comprises, in the order from the first main side 11 to the second main side 12 a second anode electrode 46, a p-type second anode layer 45, a n⁻-type second drift layer 44, a p-type second base layer 43, an n-type second cathode layer 42, and a second cathode electrode 41. Each second GCT cell 40 further comprises a second gate electrode 47 which is arranged lateral to the second cathode layer 42 and separated from the second cathode layer 42 by the second base layer 43.

The first and the second drift layers 24, 44 have a net doping concentration exemplarily between $n=5.0 \cdot 0.10^{11}$ cm$^{-3}$ and $n=1.0 \cdot 10^{14}$ cm$^{-3}$, or exemplarily less than $5 \cdot 10^{13}$ cm$^{-3}$. Throughout this specification, the net doping concentration of a layer is the maximum doping concentration. Exemplarily, the first and second drift layers 24, 44 all have the same net doping concentration. The first and second base layers 23, 43 as well as the first and second anode layers 25, 45 have a net doping concentration exemplarily between $p=1 \cdot 10^{16}$ cm$^{-3}$ and $p=1 \cdot 10^{19}$ cm$^{-3}$, and the first and second cathode layers 22, 42 have a net doping concentration exemplarily between $n=1 \cdot 10^{18}$ cm$^{-3}$ and $n=1 \cdot 10^{21}$ cm$^{-3}$. Exemplarily, the first and the second base layers 23, 43 all have the same net doping concentration. Further, the first and second anode layers 25, 45 may all have the same net doping concentration. Moreover the first and second base layers as well as the first and second anode layers may all have the same net doping concentration. Likewise, the first and second cathode layers 22, 42 may all have the same net doping concentration.

In the present embodiment the first and second base layers 23, 43 as well as the first and second anode layers 25, 45 exemplarily have a depth in a direction perpendicular to the first and second main side 11, 12 of the wafer 10 between 2 μm and 250 μm, or exemplarily between 10 μm and 150 μm. Exemplarily, the first and second base layers have all the same depth. Likewise, exemplarily the first and second anode layers 25 have all the same depth. Therein, the depth of the first and second base layers 23, 43 can be the same as the depth of the first and second anode layers 25, 45 as shown in FIG. 1, or the depth of the first and second anode layers 25, 45 can be less than the depth of the first and second base layers. Throughout this specifications, the term "depth" shall indicate the maximum distance to which a layer extends from that main side adjacent to which said layer is arranged, i.e. for the first base layer 23 it is the maximum distance from the first main side 11 in a direction perpendicular to the first main side 11. The thickness of the first and second drift layers 24, 44 in a direction perpendicular to the first and second main side 11, 12 of the wafer 10 depends on the rated voltage of the device. It is exemplarily between 350 μm and 440 μm for a 3.3 kV device or between 480 μm and 570 μm for a 4.5 kV device. Exemplarily, the first and second drift layers 24, 44 have all the same thickness. Therein, the thickness of the first (second) drift layer 24 (44) in a first (second) GCT cell 20 (40) is the minimum distance between the first (second) anode layer 25 (45) and the first (second) base layer 23 (43) of this first (second) GCT cell 20 (40).

The first GCT cell 20 in a first cell zone alternates with the second GCT cell 40 in a second cell zone. The first base layer 23 of each first GCT cell 20 is separated from neighbouring second anode layers 45 by an n-type first separation region 50, respectively. Likewise the second base layer 43 of each second GCT cell 40 is separated from neighbouring first anode layers 25 by an n-type second separation region 60, respectively. In the present embodiment, the first and second drift layers 24 and 44 of the plurality of first and second GCT cells 20 and 40 form a continuous n-type layer extending parallel to and between the first and second main side 11, 12 of the wafer 10. The separation between a first and second cell zone is made of an n doped separation region 50, 60 (exemplarily by the first and second drift layer 24, 44 extending to the surface of the device such that the drift layer 24, 44 (i.e. the separation region 50) separates the p doped first base and second anode layer 23, 45 and the p doped second base and first anode layer 25, 43 so that heat can spread into the neighboured cell zone.

The first and the second separation regions 50, 60 have a lateral width (which is the lateral distance between a first or second anode layer 25, 45 and a neighbouring second or first base layer 23, 43) exemplarily between 20 μm and 100 μm. The width of the first and the second separation regions 50, 60 must be large enough to avoid a punch-through effect to block the gate voltage required for turn-off or during blocking. On the other side the lateral width should be small enough to allow the electron hole plasma of each first GCT cell 20, which forms in the first drift layer 24, to spread into the neighbouring second GCT cells 40, and to allow the electron hole plasma of each second GCT cell 40, which forms in the second drift layer 44, to spread into the neighbouring first GCT cells 20. As shown in FIG. 1, a first passivation layer 51 is formed on each first separation region 50, and a second passivation layer 61 is formed on each second separation region 60.

In an exemplary embodiment, for each first gate commutated thyristor cell, the lateral distance between any point in the first base layer 23 of a first gate commutated thyristor cell and the neighbouring second anode layer 45 is less than a first maximum distance (dashed arrow line in FIG. 1 below the first base layer 23). The lateral distance between any point of the first anode layer 25 of this first gate commutated thyristor cell and the neighbouring second base layer 43 may also be less than the first maximum distance. Exemplarily, the first maximum distance is 1 mm, or 500 µm. That means that the first maximum distance corresponds to the width of the first base layer 23 plus the width of such separation region 50 being arranged between the first base layer 23 and the neighbouring second anode layer 45. Correspondingly, the first maximum distance also corresponds to the width of the first anode layer 25 plus the width of such separation region 60 being arranged between the first anode layer 25 and the neighbouring second base layer 43.

In another exemplary embodiment, the lateral distance between any point in the second base layer 43 of a second GCT cell and the neighbouring first anode layer 25 is less than a second maximum distance (dashed arrow line in FIG. 1 above the second base layer 43). The lateral distance between any point of the second anode layer 45 of this second GCT cell and the neighbouring first base layer 23 is less than the second maximum distance. Exemplarily, the second maximum distance is 1 mm, or 500 µm. That means that the second maximum distance corresponds to the width of the second base layer 43 plus the width of such separation region 60 being arranged between the second base layer 43 and the neighbouring first anode layer 25. Correspondingly, the second maximum distance may also correspond to the width of the second anode layer 45 plus the width of such separation region 50 being arranged between the second anode layer 45 and the neighbouring first base layer 23.

In the present embodiment each one of the first cathode layers 22 includes three strip-shaped cathode layer regions 22a, 22b, and 22c, which are separated from each other by the first base layer 23. Likewise each one of the second cathode layers 42 includes three strip-shaped cathode layer regions 42a, 42b, and 42c, which are separated from each other by the second base layer 43. That means that each first (second) GCT cell 20 (40) comprises only one first (second) cathode layer 22 (42), but comprises a plurality of first (second) cathode layer regions 22a, 22b, 22c (42a, 42b, 42c). Throughout the specifications strip-shaped means a longitudinal shape wherein the length in the longitudinal direction is longer than the width of the strip-shaped region in a width direction perpendicular to the longitudinal direction and parallel to the first or second main side of the wafer. Exemplarily, the three strip-shaped cathode layer regions 22a, 22b, and 22c are arranged such that their length sides face each other.

The first and second anode layers 25 and 45 are also strip-shaped but have a wider lateral width than the strip-shaped cathode layer regions 22a, 22b, and 22c. This can be seen best in FIG. 1, where the lateral width is the distance between the respective left end and the respective right end.

In the present embodiment each first gate electrode 27 is formed as part of a first gate metallization layer 81 (see FIG. 2) on the first base layers 23, wherein the surface of the first gate metallization layer 81 opposite to the first base layers 23 defines a first plane. Further, each second gate electrode 47 is formed as part of a second gate metallization layer 82 (see FIG. 4) on the second base layers 43, wherein the surface of the second gate metallization layer 82 opposite to the second base layers 43 defines a second plane. The surfaces of the first cathode electrodes 21 opposite to the first cathode layers 22 and the surfaces of the second anode electrodes 46 opposite to the second anode layers 45 define/form a third plane, and the surfaces of the first anode electrodes 26 opposite to the first anode layers 25 and the surfaces of the second cathode electrodes 41 opposite to the second cathode layers 42 define/form a fourth plane. In other words, all first cathode electrodes 21 and all second anode electrodes 46 are all arranged in the same plane. Likewise, all second cathode electrodes 41 and all first anode electrodes 26 are all arranged in the same plane. Therein, the first plane is parallel to the third plane and is shifted from the third plane in a direction from the first main side 11 to the second main side 12, and the second plane is parallel to the fourth plane and is shifted from the fourth plane in a direction from the second main side 12 to the first main side 11. This mesa structure facilitates contacting the first cathode electrodes 21 and the second anode electrodes 46 on the first main side 11 with a first metal plate, such as a molybdenum disk, and contacting the second cathode electrodes 41 and the first anode electrodes 26 on the second main side 12 with a second metal plate, such as a molybdenum disk, in a standard press pack.

In the present embodiment, in a projection orthogonal to the first and second main side 11, 12, the first anode layer 25 of each first GCT cell 20 is aligned with the first cathode layer 22 of the same first GCT cell 20 to have a maximum overlap between these two layers (i.e. a maximum area of overlap between the first anode layer 25 and the first cathode layer regions 22a, 22b, 22c) in each first GTC cell 20, and the second anode layer 45 of each second GCT cell 40 is aligned with the second cathode layer 42 of the same second GCT cell 40 to have a maximum overlap between these two layers (i.e. a maximum area of overlap between the second anode layer 25 and the second cathode layer regions 42a, 42b, 42c) in each second GTC cell 40.

FIG. 2 shows a top view onto the first main side 11 of the wafer 10. In the top view shown in FIG. 2 there can be seen the pattern of first cathode electrodes 21 formed on the top surface of the cathode layer regions 22a, 22b, and 22c of the first GCT cells 20 and of the anode electrodes 46 which are formed on the top surface of the second anode layers 45, respectively. Each first cathode electrode 21 comprises three strip-shaped electrode portions which correspond to the three cathode layer regions 22a, 22b, and 22c of the respective first GCT cell 20. Accordingly, each first GCT cell 20 comprises only one first cathode electrode 21 including a plurality of electrode portions which are separated from each other. The anode electrode 46 is strip-shaped corresponding to the strip-shape of the second anode layer 45 of the respective second GCT cell.

The longitudinal directions of the strip-shaped electrode portions of each first cathode electrode 21 and the strip-shaped anode electrodes 46 have its longitudinal direction aligned in radial direction which is a direction extending from the center of the device and being parallel to the first main side 11 of the wafer 10. Therein, the center of the device is the center of the first main side 11 of the circular wafer 10.

The lateral width of each first and second base layer 23, 43 in a direction perpendicular to the longitudinal axis of the strip-shaped cathode layer regions of the same first or second GCT cell 20, 40 (i.e. the extension of the first or second base layer 23, 43 between two separation regions 50, 60, which is the distance between the respective left end and the respective right end in FIG. 1) is exemplarily less than 1 mm, or exemplarily less than 500 µm. Likewise the lateral width of the first and second anode layers 25, 45 in a direction perpendicular to its longitudinal axis (i.e. the extension of the first or second anode layer 25, 45 between two separation regions 60, 50) is exemplarily less than 1 mm, or exemplarily less than 500 µm. The ratio between the lateral width of the first base layer 23 and that of the first anode layer 25 in each first GCT cell 20 and the ratio between the lateral width of the second base layer 43 and that of the second anode layer 45 in each second GCT cell 40 is exemplarily between 0.5 and 2, or exemplarily it is 1.

The lateral width of each strip-shaped cathode semiconductor layer region 22a, 22b, 22c, 42a, 42b, and 42c in a direction perpendicular to its longitudinal axis is between 50 µm and 500 µm.

The plurality of first GCT cells 20 and the plurality of second GCT cells 40 are arranged in three concentric rings around the center of the device. In each ring the first GCT cells 20 alternate with the second GCT cells 40. Therefore, in FIG. 2 the second anode electrodes 46 alternate with the first cathode electrodes 21, which comprise three strip-shaped electrode portions, respectively, as described above. In FIG. 2 the second anode electrodes 46 can be identified as the strips with the larger lateral width perpendicular to its longitudinal axis, and the strip-shaped electrode portions, which form the first cathode electrodes 21, can be identified as the strips with the smaller lateral width perpendicular to its longitudinal axis.

In the center region on the first main side 11 of the circular wafer 10 there is arranged a first common gate contact 71 to which all first gate electrodes 27 of the plurality of first GCT cells 20 are electrically connected. The first gate electrodes 27 of the first GCT cells 20 and the connections there between are implemented as the first gate metallization layer 81.

In FIG. 4 there is shown the top view onto the second main side 12 of the bidirectional power semiconductor device 1. Due to the symmetric arrangement of first and second GCT cells 20, 40 there can be seen an electrode pattern of the first anode electrodes 26 and the second cathode electrodes 41 which is similar to the electrode pattern of the first cathode electrodes 21 and the second anode electrodes 46 shown in

FIG. 2.

In FIG. 4 the first anode electrodes 26 alternate with the second cathode electrodes 41, which comprise three strip-shaped electrode portions, respectively. Each second GCT cell 40 comprises only one second cathode electrode 41 including a plurality of electrode portions, which are separated from each other. In FIG. 4 the first anode electrodes 26 can be identified as the strips with the larger lateral width perpendicular to its longitudinal axis, and the strip-shaped electrode portions, which form the second cathode electrodes 41, can be identified as the strips with the smaller lateral width perpendicular to its longitudinal axis.

In the center region on the second main side 12 of the wafer 10 there is arranged a second common gate contact 72 to which all second gate electrodes 47 of the plurality of second GCT cells 40 are electrically connected. The second gate electrodes 47 of the second GCT cells 40 and the connections there between are implemented as the second gate metallization layer 82.

The bidirectional power semiconductor device of the present invention provides a bidirectional turn-off thyristor (BTT) which allows full gate control of both, turn-on and turn-off, for current flowing in both directions vertical to the first and second main side 11, 12 of the wafer 10. Due to the interdigitated arrangement of first and second GCT cells 20, 40, the full silicon area of the wafer 10 is utilized both electrically and thermally. The gate control for turn-on and turn-off of the first and second GCT cells 20, 40 can employ a low inductance gate control like in an integrated gate commutated thyristor (IGCT) or can employ a standard GTO thyristor gate control for soft switching depending on the application requirement. Two separate gate control units are exemplarily employed for the first and second GCT cells.

It will be apparent for persons skilled in the art that modifications of the above described embodiment are possible without departing from the idea of the invention as defined by the appended claims.

In the above described embodiment the bidirectional power semiconductor device 1 was described with first and second cathode layers 22, 42 which comprise three strip-shaped cathode layer regions 22a, 22b, 22c or 42a, 42b, 42c, respectively. However, it is also possible to have only one continuous cathode layer region in each first or second cathode layer, or to have any other number of cathode layer regions in each first or second cathode layer. Exemplarily, each first and second cathode layer 22, 42 comprises 2 to 6 strip-shaped cathode layer regions.

In the above described embodiment the bidirectional power semiconductor device 1 was described with a circular silicon wafer 10. However, the wafer 10 may have any other shape, such as a rectangular shape, or may be made of a different semiconductor material, such as silicon carbide or a group-III-nitride such as (AlGaIn)N.

The embodiment of the invention was described with a very specific arrangement of strip-shaped first and second GCT cells. However other arrangements may employed, such as a parallel arrangement of strip-shaped first and second GCT cells on a rectangular wafer, or a honeycomb arrangement of honeycomb-shaped first and second GCT cells, or a regular arrangement of circular first and second GCT cells, or an arrangement of polygon-shaped first and second GCT cells in a regular pattern.

The above embodiments were explained with specific conductivity types. The conductivity types of the semiconductor layers in the above described embodiments might be switched, so that all layers which were described as p-type layers would be n-type layers and all layers which were described as n-type layers would be p-type layers. For example, in a modified embodiment, the first/second GCT cells 20, 40 could include a p-doped first/second cathode semiconductor layer 22, 42, a n-doped first/second base layer 23, 43, a p-doped first/second drift layer 24, 44, and a n-doped first/second anode layer 25, 45.

All embodiments were described with a central first and second common gate contact 71, 72. However, the invention is not limited to such central common gate contacts 71, 72. It would also be possible to have ring-shaped first and second common gate contacts at the perimeter of the wafer 10 or even between two rings somewhere between the perimeter and the center of the wafer 10.

It should be noted that the term "comprising" does not exclude other elements or steps and that the indefinite article "a" or "an" does not exclude the plural. Also elements described in association with different embodiments may be combined.

LIST OF REFERENCE SIGNS 1 bidirectional power semiconductor device
10 wafer
11 first main side
12 second main side
20 first gate commutated thyristor (GCT) cell
21 first cathode electrode
22 first cathode layer
22a, 22b, 22c cathode layer region
23 first base layer
24 first drift layer
25 first anode layer
26 first anode electrode
27 first gate electrode
40 second gate commutated thyristor (GCT) cell
41 second cathode electrode
42 second cathode layer
42a, 42b, 42c cathode layer region
43 second base layer
44 second drift layer
45 second anode layer
46 second anode electrode
47 second gate electrode
50 first separation region
51 first passivation layer
60 second separation region
61 second passivation layer
71 first common gate contact
72 second common gate contact
81 first metallization layer
82 second metallization layer

The invention claimed is:

1. A bidirectional power semiconductor device with a wafer having a first main side and a second main side, which is arranged parallel to the first main side, the bidirectional power semiconductor device comprising:
at least one first gate commutated thyristor cell and at least one second gate commutated thyristor cell,
wherein each first gate commutated thyristor cell comprises the following layers in the order from the first main side to the second main side:
a first cathode electrode;
a first cathode layer of a first conductivity type;
a first base layer of a second conductivity type different from the first conductivity type;
a first drift layer of the first conductivity type;
a first anode layer of the second conductivity type; and
a first anode electrode,
wherein each first gate commutated thyristor cell further comprises a first gate electrode which is arranged lateral to the first cathode layer and separated from the first cathode layer by the first base layer,
wherein each second gate commutated thyristor cell comprises the following layers in the order from the first main side to the second main side:
a second anode electrode;
a second anode layer of the second conductivity type;
a second drift layer of the first conductivity type;
a second base layer of the second conductivity type;
a second cathode layer of the first conductivity type; and
a second cathode electrode,
wherein each second gate commutated thyristor cell further comprises a second gate electrode which is arranged lateral to the second cathode layer and separated from the second cathode layer by the second base layer, wherein
the bidirectional power semiconductor device comprises at least two first gate commutated thyristor cells and at least two second gate commutated thyristor cells, wherein the first gate commutated thyristor cells alternate with the second gate commutated thyristor cells,
the first base layer of each first gate commutated thyristor cell is separated from a neighboring second anode layer in a second gate commutated thyristor cell by the first drift layer and the second drift layer extending to the surface of the device, thereby forming a first separation region of the first conductivity type between the first base layer and the second anode layer, and
the second base layer of each second gate commutated thyristor cell is separated from a neighbouring first anode layer in a first gate commutated thyristor cell by the first drift layer and the second drift layer extending to the surface of the device, thereby forming a second separation region of the first conductivity type between the second base layer and the first anode layer.

2. The bidirectional power semiconductor device according to claim 1, wherein for each first gate commutated thyristor cell:
the lateral distance between any point in the first base layer of this first gate commutated thyristor cell and the neighbouring second anode layer is less than a first maximum distance,
the lateral distance between any point of the first anode layer of this first gate commutated thyristor cell and the neighbouring second base layer is less than the first maximum distance,
the first maximum distance is 1 mm.

3. The bidirectional power semiconductor device according to claim 2, wherein for each second gate commutated thyristor cell:
the lateral distance between any point of the second base layer of this second gate commutated thyristor cell and the neighbouring first anode layer is less than a second maximum distance,
the lateral distance between any point in the second anode layer of this second gate commutated thyristor cell and the neighbouring first base layer is less than the second maximum distance,
the second maximum distance is 1 mm.

4. The bidirectional power semiconductor device according to claim 2, wherein in a projection in a direction orthogonal to the first and second main side, the first anode layer overlaps with the first cathode layer in each first gate commutated thyristor cell, and the second anode layer overlaps with the second cathode layer in each second gate commutated thyristor cell.

5. The bidirectional power semiconductor device according to claim 2, wherein for each second gate commutated thyristor cell:
the lateral distance between any point of the second base layer of this second gate commutated thyristor cell and the neighbouring first anode layer is less than a second maximum distance, the lateral distance between any point in the second anode layer of this second gate commutated thyristor cell and the neighbouring first base layer is less than the second maximum distance, the second maximum distance is 500 µm.

6. The bidirectional power semiconductor device according to claim 1, wherein for each second gate commutated thyristor cell:

the lateral distance between any point of the second base layer of this second gate commutated thyristor cell and the neighbouring first anode layer is less than a second maximum distance, the lateral distance between any point in the second anode layer of this second gate commutated thyristor cell and the neighbouring first base layer is less than the second maximum distance, the second maximum distance is 1 mm.

7. The bidirectional power semiconductor device of claim 6, wherein in a projection in a direction orthogonal to the first and second main side, the first anode layer overlaps with the first cathode layer in each first gate commutated thyristor cell, and the second anode layer overlaps with the second cathode layer in each second gate commutated thyristor cell.

8. The bidirectional power semiconductor device according to claim 1, wherein in a projection in a direction orthogonal to the first and second main side, the first anode layer overlaps with the first cathode layer in each first gate commutated thyristor cell, and the second anode layer overlaps with the second cathode layer in each second gate commutated thyristor cell.

9. The bidirectional power semiconductor device according to claim 8, wherein in the projection in the direction orthogonal to the first and second main side, the first anode layer is aligned with the first cathode layer to have a maximum overlap between these two layers in each first gate commutated thyristor cell, and the second anode layer is aligned with the second cathode layer to have a maximum overlap between these two layers in each second gate commutated thyristor cell.

10. The bidirectional power semiconductor device according to claim 1, wherein:

each first gate electrode is formed as part of a first gate metallization layer on the first base layers, the surface of the first gate metallization layer opposite to the first base layers defining a first plane, each second gate electrode is formed as part of a second gate metallization layer on the second base layers, the surface of the second gate metallization layer opposite to the second base layers defining a second plane, the surfaces of the first cathode electrodes opposite to the first cathode layers and the surfaces of the second anode electrodes opposite to the second anode layers define a third plane, the surfaces of the first anode electrodes opposite to the first anode layers and the surfaces of the second cathode electrodes opposite to the second cathode layers define a fourth plane, the first plane is parallel to the third plane and is shifted from the third plane in a direction from the first main side to the second main side, and the second plane is parallel to the fourth plane and is shifted from the fourth plane in a direction from the second main side to the first main side.

11. The bidirectional power semiconductor device according to claim 1, wherein each one of the first and second cathode layers includes at least two cathode layer regions, which are separated from each other by the first or second base layer.

12. The bidirectional power semiconductor device according to claim 11, wherein each one of the cathode layer regions, is strip-shaped with a length in the longitudinal axis and a width in a direction vertical to the longitudinal axis, wherein the width is less than the length.

13. The bidirectional power semiconductor device according to claim 12, wherein each one of the first and second cathode layers comprises 2 to 6 strip-shaped cathode layer regions.

14. The bidirectional power semiconductor device according to claim 12 wherein the width of each strip-shaped cathode semiconductor layer region is between 50 µm and 500 µm.

15. The bidirectional power semiconductor device according to claim 12, wherein the strip-shaped cathode layer regions are placed in concentric rings around the center of the device, the longitudinal axis of each strip extending along a radial direction which is a direction extending from the center of the device and parallel to the first and second main side.

16. The bidirectional power semiconductor device according to claim 1, wherein the ratio between a lateral width of the first base layer and that of the first anode layer and the ratio between a lateral width of the second base layer and that of the second anode layer are between 0.5 and 2, respectively.

17. The bidirectional power semiconductor device according to claim 1, wherein the first and second drift layers of the first and second gate commutated thyristor cells form one continuous semiconductor layer extending parallel to and between the first and second main side of the wafer.

18. The bidirectional power semiconductor device according to claim 1, wherein the first and the second base layers have a greater thickness in a direction orthogonal to the first and second main side than the first and second anode layers.

19. The bidirectional power semiconductor device according to claim 1, wherein the distance between each pair of neighbouring first base layer and second anode layer and the distance between each pair of neighbouring second base layer and first anode layer is in a range between 20 µm and 100 µm.

20. The bidirectional power semiconductor device according to claim 1, wherein for each first gate commutated thyristor cell:

the lateral distance between any point in the first base layer of this first gate commutated thyristor cell and the neighbouring second anode layer is less than a first maximum distance, the lateral distance between any point of the first anode layer of this first gate commutated thyristor cell and the neighbouring second base layer is less than the first maximum distance, the first maximum distance is 500 µm.

* * * * *